United States Patent [19]

Weibler

[11] Patent Number: 5,510,575
[45] Date of Patent: Apr. 23, 1996

[54] WINDOW WALL FOR SHIELDED ENCLOSURES

[75] Inventor: Joseph C. Weibler, West Chicago, Ill.

[73] Assignee: The Curran Company, Glendale Heights, Ill.

[21] Appl. No.: 158,635

[22] Filed: Nov. 26, 1993

[51] Int. Cl.$^6$ .................................................. H05K 9/00
[52] U.S. Cl. ........................................ 174/35 MS; 361/816
[58] Field of Search ........................... 174/35 R, 35 MS, 174/35 GC; 66/202; 139/425 R; 361/816, 818

[56] References Cited

U.S. PATENT DOCUMENTS

| | | | |
|---|---|---|---|
| 3,601,946 | 8/1971 | Rothemund | 52/731 |
| 4,696,547 | 9/1987 | Sims | 350/319 |
| 4,794,206 | 12/1988 | Weinstein | 174/35 MS |
| 4,806,703 | 2/1989 | Sims | 174/35 MS |
| 4,932,180 | 6/1990 | Takahashi et al. | 174/35 MS X |
| 4,959,504 | 9/1990 | Yarger et al. | 174/35 MS |
| 4,978,812 | 12/1990 | Akeyoshi et al. | 174/35 MS |
| 5,012,041 | 4/1991 | Sims et al. | 174/35 MS |
| 5,139,850 | 8/1992 | Clarke et al. | 428/192 |
| 5,147,694 | 9/1992 | Clarke | 428/34 |
| 5,364,685 | 11/1994 | Nakashima et al. | 428/155 |
| 5,401,901 | 3/1995 | Gerry et al. | 174/35 MS |

FOREIGN PATENT DOCUMENTS

| | | |
|---|---|---|
| 0082606 | 6/1983 | European Pat. Off. . |
| 0328952 | 2/1989 | European Pat. Off. . |
| 3938124 | 5/1991 | Germany . |
| 9106114 | 8/1991 | Germany . |
| 4021750 | 1/1992 | Germany . |

*Primary Examiner*—Kristine L. Kincaid
*Assistant Examiner*—Christopher Horgan
*Attorney, Agent, or Firm*—Mason, Kolehmainen, Rathburn & Wyss

[57] ABSTRACT

A window wall for shielded enclosures is provided for use in a large opening in a shielded enclosure that preserves the shielding integrity of the shielded enclosure and that is easy to install. The window wall includes a frame having a frame perimeter received within a shielded enclosure window opening in electrical conductive engagement with the shielded enclosure. The frame includes a selected number of horizontal muntins and vertical mullions defining a plurality of clear window openings. A window unit frame is received in each clear window opening supported by and electrically connected to the frame. A pair of spaced apart radio frequency shielding continuous screens span each window opening and are supported by the window unit frame. Each screen is formed of electrically conductive mesh material and is mechanically and electrically connected with the window unit frame, thereby providing continuous electrical contact with the shielded enclosure.

10 Claims, 2 Drawing Sheets

WINDOW WALL FOR SHIELDED ENCLOSURES

BACKGROUND OF THE INVENTION

1. Field of the Invention

The present invention relates to electromagnetic interference (EMI) shielding and more particularly to a window wall for a shielded enclosure.

2. Description of the Prior Art

Shielded enclosures are used to attenuate interference from electromagnetic radiation, such as radio frequency radiation. Such enclosures may include a single shield of electrically conductive metal or multiple shields of electrically conductive metal and/or metal mesh entirely enclosing a shielded space. Where apertures are required in the shield for windows, doors, ventilation, power feedthrus and the like, it is important to maintain the integrity of the shielding.

Typical windows for shielded enclosures used in the past have included one or two fine wire mesh screens electrically connected to the shield or shields of the enclosure. One difficulty with screen windows is that they are not optically transparent. Even with extremely fine wire screens, visibility through the window is impaired. When two screens are employed, typically visual interference occurs in waves or patterns caused by a moire effect. U.S. Pat. No. 5,012,041, issued Apr. 30, 1991, and assigned to the present assignee, discloses a screened window including two wire screens having different mesh patterns arranged for substantially avoiding conventional optical interference.

While the screened window disclosed by the above-identified patent provides substantial improvements over the prior art arrangements, it is desirable to provide an improved window for larger openings or a window wall for a shielded enclosure that is easy to install and that effectively preserves the shielding integrity of the shielded enclosure.

SUMMARY OF THE INVENTION

Among the objects of the present invention are to provide a window wall for shielded enclosures that is adapted for use in a large opening in the shielded enclosure, for example, to provide a curtain wall for the shielded enclosure and that preserves the shielding integrity of the shielded enclosure, to provide a window wall that is easy to install and to provide an improved window wall for shielded enclosures overcoming disadvantages of those used in the past.

In brief, in accordance with the present invention, there is provided a window wall for a shielded enclosure including a frame having a frame perimeter received within a shielded enclosure window opening in electrical conductive engagement with the shielded enclosure. The frame includes a selected number of horizontal muntins and vertical mullions defining a plurality of clear window openings. A window unit frame is received in each clear window opening supported by and electrically connected to the frame. A pair of spaced apart radio frequency shielding continuous screens spans each window opening and are supported by the window unit frame. Each screen is formed of electrically conductive mesh material and is mechanically and electrically connected with the window unit frame, thereby providing continuous electrical contact with the shielded enclosure.

BRIEF DESCRIPTION OF THE DRAWING

The present invention together with the above and other objects and advantages may be best understood from the following detailed description of the preferred embodiment of the invention shown in the drawing, wherein.

DETAILED DESCRIPTION OF THE PREFERRED EMBODIMENT

Figure 1:
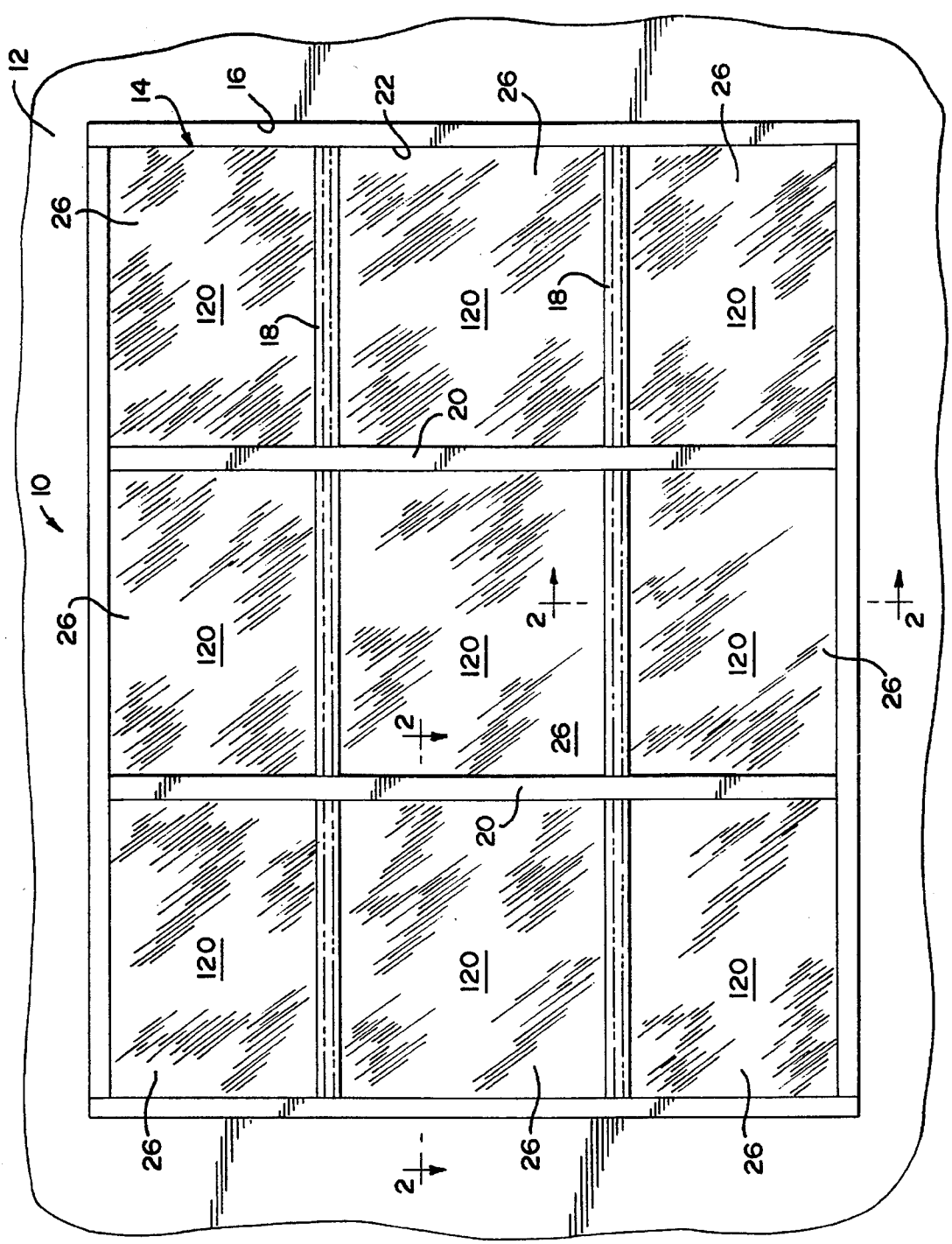
FIG. 1 is an elevational view of a window for a shielded enclosure.
Figure 2:
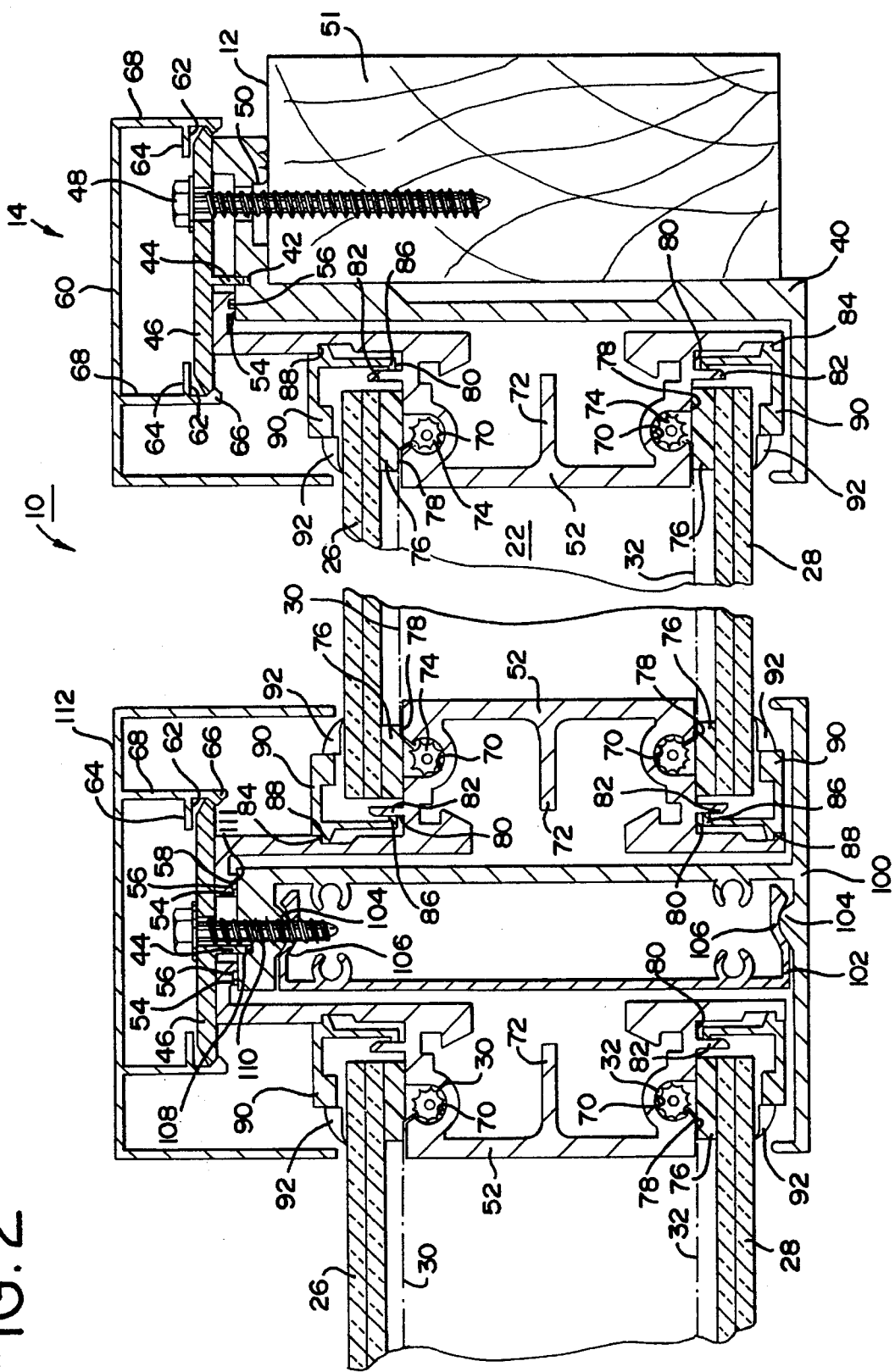
FIG. 2 is an enlarged sectional view taken along the line 2—2 of FIG. 1.

Having reference now to FIGS. 1 and 2 of the drawing, there is illustrated a window wall generally designated as 10 constructed in accordance with the principles of the present invention. The window wall 10 as illustrated in FIGS. 1 and 2 is intended for use with a shielded enclosure 12, and serves to maintain the shielding integrity of the shielded enclosure while providing visual access within the enclosure.

Window wall 10 includes a frame structure 14 suitable for mounting in a large window opening 16 of the shielded enclosure 12. Frame 14 fits snugly within the window wall opening 16 having selected outside dimensions corresponding to the nominal dimensions of the shielded enclosure opening 16. Frame 14 includes a selected number of horizontal muntins 18 and vertical mullions 20 defining a plurality of clear window openings 22. An optional pair of spaced apart, light-transmitting window panels or window panes 26 and 28 can be provided in each window opening 22, as shown. A pair of spaced apart radio frequency (RF) shielding continuous screens 30 and 32 spans each window opening 22. A respective adjacent window pane 26 or 28 covers an adjacent screen 30 or 32.

In accordance with features of the invention, window wall 10 can be made for virtually any size of aperture 16. Window wall 10 has a selected maximum height in the range between 300 to 360 centimeters or 10 to 12 feet and unlimited length corresponding to the number of windows desired. The modular arrangement of window wall 10 facilitates prefabrication including pre-assembly, then the window wall 10 advantageously is disassembled and shipped as a kit to the location of a particular shielded enclosure 12. The modular window wall 10 is adapted for easy installation and removal of large glass panels 26 and 28, for example, 120 centimeters wide by 180 to 300 centimeters tall (4 feet wide by 6 to 10 feet tall). Window wall 10 includes a universally understood glazing system that adds flexibility in the removal and replacement of broken window panes 26 and 28 at remote site locations of the shielded enclosures 12, without requiring special education for specifically trained installers that otherwise would be required.

A conductive metallic sheet material, for example, such as, copper, forms the shielded enclosure 12. Each of the pair of light-transmitting panels or panes 26 and 28 are formed, for example, of laminated safety glass having a selected thickness, such as ¼ inch or 0.64 centimeters. RF shielding screens 30 and 32 advantageously are of the screen mesh selection criteria as disclosed in the above-identified U.S. Pat. No. 5,012,041. The subject matter of U.S. Pat. No. 5,012,041 is incorporated herein by reference. For example, RF shielding screen 30 can be a 20 mesh with a 30 mesh for RF shielding screen 32, both formed of a type 304 or 316 stainless steel.

Frame structure 14 includes a perimeter structural support member 40 extending around entire opening 16 in the shielded enclosure 12. Perimeter structural support member 40 includes a notch 42 cooperatively located for receiving a stop leg 44 defined in an RF clamping member 46. A plurality of fasteners 48 spaced apart at predetermined intervals are received through the RF clamping member 46 and an interior mounting flange portion 50 of perimeter structural support member 40 extending into a support member 51 normally formed of wood used to frame in the window opening 16. Perimeter structural support member 40 is held in intimate contact engagement with the RF shielded enclosure 12.

A window unit frame 52 fits inside the perimeter support member 40. A double contact point surface generally designated by 54 formed by window unit frame 52 defines a notch 56 that accepts an RF gasket 58. The double contact point surface 54 is held in intimate contact engagement with the perimeter structural support member 40. The stop leg 44 in the RF clamping member 46 enables sufficient clamping force without resulting in deflection in the RF clamping member 46 and also enables precise positioning and alignment of the finish trim. As a result, a proper fit is enabled of a perimeter finish trim 60 that snaps over the RF clamping member 46 and is held in press fit engagement by a pair of channels 62 each defined by an arm 64 and an enlarged terminal end 66 of legs 68. The window unit frame 52 forms a pair of screen receiving channels 70 for receiving the RF shielding screens 30 and 32. A backwardly extending leg 72 of the window unit frame 52 provides rigidity to avoid bowing with the RF shielding screens 30 and 32 installed. Each RF shielding screen 30, 32 is formed of electrically conductive mesh material and is mechanically and electrically connected with the window unit frame 52. Each of a pair of screening splines 74 holds a respective one of the RF shielding screens 30 and 32 in the screen receiving channels 70 providing high conductivity electrical contact between the shielding screens and the frame 52.

A glazing tape 76 supports the window panes 26 and 28 on the window unit frame 52. Glazing tape 76 has only one adhesive side 78 that adhesively engages the window unit frame 52. A pair of spaced apart channels 80 defined by tabs 82 and a stop ledge 84 formed by the window unit frame 52 engage a cooperating arm 86 and a cooperating stop portion 88 of a window unit glazing trim 90. A conventional glazing spline 92 sandwiched in press fit engagement between the window unit glazing trim 90 and a respective window pane 26 or 28 supports and seals the window panes 26 and 28 with the window unit glazing trim 90, A resilient deformable material, such as rubber, forms the conventional glazing spline 92.

Interior horizontal muntins 18 and vertical mullions 20 include a pair of cooperating support members 100 and 102 having respective cooperating bumps and C-shaped wing portions 104 and 106 for snap fit engagement together. In general interior horizontal muntins 18 and vertical mullions 20 are arranged in a similar fashion as in the perimeter support member 40 including the RF clamping member 46, a pair of the window frame units 52, screening splines 74, window unit glazing trim 90 and glazing spline 92. Center support frame member 100 includes a notch 108 cooperatively located for receiving the stop leg 44 defined in the RF clamping member 46. Fasteners 110 are received through the RF clamping member 46 and the support members 100 and 102. The double contact point surfaces 54 of the window frame units 52 are held in intimate contact engagement with a contact surface 111 of the center structural support member 100. A snap-on center finish trim 112 snaps over the RF clamping member 46 and is held in press fit engagement by a pair of channels 62 each defined by an arm 64 and an enlarged terminal end 66 of legs 68.

Structural support members 40, 100 and 102 defining frame 14 provide rigidity and shielding integrity to the window wall 10. Structural support members 40, 100 and 102, the window unit frames 52, the RF clamping members 46, the window unit glazing trim 90 and the finish trims 60 and 112 advantageously are formed of an alloy of aluminum, such as a 6063-T5 aluminum alloy, that is easy to extrude and has sufficient electrical conductivity for RF shielding. An aluminum bronze arc spray is used to prevent aluminum oxide from forming on the extruded aluminum members and for forming a solid metal barrier on surfaces where high electrical conductivity is required, such as surfaces 50, 54, 111 of the extruded members 40, 52, 100.

A plurality of modular window units 120 having selected sizes for a particular window wall 10 can be assembled and shipped to a remote site of the shielded enclosure 12. Each modular window unit 120 includes the window unit frame 52 with the RF shielding screens 30 and 32 held in place in the window unit frame 52 by the pair of screening splines 74, glazing tape 76 supporting the window panes 26 and 28 on the window unit frame 52, with the glazing spline 92 sandwiched in press fit engagement between the window unit glazing trim 90 and each respective window pane 26 and 28. Then modular window units 120 are inserted into the frame 14 and the clamping members 46 are mounted to mechanically and electrically connect the modular window units 120 with the frame 14 and shielded enclosure 12. Then the perimeter finish trim 60 and the snap-on center finish trim 112 are installed to complete the window wall 10.

The drawing illustrates installation of window wall 10 in a shielded enclosure 12 having a single shield including a single layer of metal. The window wall 10 may also be employed in double shielded enclosures of various types. Moreover, one or more shields may be incorporated into a shielded room 12 having finished interior and exterior walls with various architectural treatments. Some shielded enclosures utilize screen or mesh in place of continuous conductive metal layers such as the layer 12, and terms such as metal shield or metal layer are intended to encompass both types of shield.

While the invention has been described with reference to details of the preferred embodiment, such details are not intended to limit the scope of the invention as defined in the accompanying claims.

What is claimed and desired to be secured by Letters Patent of the United States is:

1. A window wall for use in a window opening in a shielded enclosure comprising:

a frame having a frame perimeter received within said shielded enclosure window opening in electrical conductive engagement with the shielded enclosure;

said frame including a selected number of both horizontal muntins and vertical mullions defining a plurality of clear window openings;

said frame perimeter and both said horizontal muntins and vertical mullions include at least one support member formed of electrically conductive material;

a window unit frame received in each clear window opening; said window unit frame being supported by and electrically connected to said frame;

a pair of spaced apart radio frequency shielding continuous screens spanning each said clear window openings; and each of said screens being formed of electrically conductive mesh material and being supported by and electrically connected with said window unit frame, thereby providing continuous electrical contact with the shielded enclosure; and a pair of spaced apart, light-transmitting window panes supported by said window unit frame.

2. A window wall as recited in claim 1 further includes a glazing tape having an adhesive side and an opposed non-adhesive side, said glazing tape adhesively attached to a window pane support surface of said window unit frame and said opposed non-adhesive side of said glazing tape engages a respective one of said pair of spaced apart, light-transmitting window panes.

3. A window wall as recited in claim 2 further includes a window unit glazing trim member cooperatively positioned with said window unit frame member and a glazing spline mounted in press fit engagement between said window unit glazing trim member and one of said respective light-transmitting window panes.

4. A window wall as recited in claim 3 wherein said window unit glazing trim member is an extruded member formed of an aluminum alloy material.

5. A window wall for use in a window opening in a shielded enclosure comprising:

a frame received within said shielded enclosure window opening in electrical conductive engagement with the shielded enclosure; said frame including a perimeter support member and a selected number of both horizontal muntins and vertical mullions electrically coupled to said frame perimeter defining a plurality of clear window openings; both said horizontal muntins and vertical mullions including a pair of cooperating support members;

a window unit frame received in each of said clear window openings; said window unit frame being supported by and electrically connected to said frame;

a pair of spaced apart radio frequency (RF) shielding continuous screens spanning each said clear window openings; and each of said RF shielding screens being formed of electrically conductive mesh material and being mechanically and electrically connected with said window unit frame; and a pair of spaced apart, light-transmitting window panes covering said RF shielding screens, said light-transmitting window panes supported by said window unit frame.

6. A window wall as recited in claim 5 wherein said window unit frame and each of said support members is an extruded member formed of an aluminum alloy material.

7. A window wall as recited in claim 5 further includes a glazing tape having an adhesive side and an opposed non-adhesive side, said glazing tape adhesively attached to a window pane support surface of said window unit frame and said opposed non-adhesive side of said glazing tape engages a respective one of said pair of spaced apart, light-transmitting window panes.

8. A window wall as recited in claim 5 further includes a pair of screening splines engaging a respective one of said RF shielding screens received within a respective screen receiving channel formed by said window unit frame.

9. A window wall as recited in claim 5 wherein said frame perimeter and both said horizontal muntins and vertical mullions further include a clamping member and a plurality of fasteners mounting said clamping member to said at least one support member and said clamping member holding said window unit frame in electrical conductive engagement with said support member.

10. A window wall as recited in claim 5 wherein both said horizontal muntins and vertical mullions include a pair of cooperating support members adapted for snap fit engagement together and for supporting said window unit frame.

* * * * *